(12) United States Patent
Ryu et al.

(10) Patent No.: US 8,901,699 B2
(45) Date of Patent: Dec. 2, 2014

(54) SILICON CARBIDE JUNCTION BARRIER SCHOTTKY DIODES WITH SUPPRESSED MINORITY CARRIER INJECTION

(75) Inventors: Sei-Hyung Ryu, Cary, NC (US); Anant K. Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 242 days.

(21) Appl. No.: 11/126,816

(22) Filed: May 11, 2005

(65) Prior Publication Data

US 2006/0255423 A1  Nov. 16, 2006

(51) Int. Cl.
*H01L 29/47* (2006.01)
*H01L 29/872* (2006.01)
*H01L 29/66* (2006.01)
H01L 29/06 (2006.01)
H01L 29/16 (2006.01)

(52) U.S. Cl.
CPC ......... *H01L 29/6606* (2013.01); *H01L 29/0615* (2013.01); *H01L 29/872* (2013.01); *H01L 29/1608* (2013.01); *H01L 29/0619* (2013.01)
USPC ..... 257/475; 257/472; 257/485; 257/E29.338

(58) Field of Classification Search
CPC .................................................. H01L 29/872
USPC .......................................... 257/475, E29.338
See application file for complete search history.

(56) References Cited

U.S. PATENT DOCUMENTS 3,047,439 A  7/1962  Van Daal et al.
3,121,829 A  2/1964  Huizing et al.

(Continued)

FOREIGN PATENT DOCUMENTS

EP  0 134 456    6/1984
EP    275179 A2 * 7/1988  .............. H01L 29/91

(Continued)

OTHER PUBLICATIONS

Bhatnagar et al., Edge Terminations for High Voltage SiC Schottky Barrier Rectifiers, 1993, International Symposium on Power Semiconductor Devices, 1993 Proceedings, pp. 89-94.*

(Continued)

*Primary Examiner* — Hsin-Yi Hsieh
(74) *Attorney, Agent, or Firm* — Myers Bigel Sibley & Sajovec, P.A.

(57) ABSTRACT

Integral structures that block the current conduction of the built-in PiN diode in a junction barrier Schottky (JBS) structure are provided. A Schottky diode may be incorporated in series with the PiN diode, where the Schottky diode is of opposite direction to that of the PiN diode. A series resistance or and insulating layer may be provided between the PiN diode and a Schottky contact. Silicon carbide Schottky diodes and methods of fabricating silicon carbide Schottky diodes that include a silicon carbide junction barrier region disposed within a drift region of the diode are also provided. The junction barrier region includes a first region of silicon carbide having a first doping concentration in the drift region of the diode and a second region of silicon carbide in the drift region and disposed between the first region of silicon carbide and a Schottky contact of the Schottky diode. The second region is in contact with the first region of silicon carbide and the Schottky contact. The second region of silicon carbide has a second doping concentration that is less than the first doping concentration.

10 Claims, 6 Drawing Sheets

(56) References Cited

U.S. PATENT DOCUMENTS

| | | |
|---|---|---|
| 3,628,187 A | 12/1971 | DeLoach, Jr. et al. |
| 4,096,622 A | 6/1978 | MacIver |
| 4,262,295 A | 4/1981 | Okano et al. |
| 4,310,362 A | 1/1982 | Roche et al. |
| 4,310,568 A | 1/1982 | Howard et al. |
| 4,329,699 A | 5/1982 | Ishihara et al. |
| 4,333,100 A | 6/1982 | Morcom et al. |
| 4,352,120 A | 9/1982 | Kurihara et al. |
| 4,356,475 A | 10/1982 | Neumann et al. |
| 4,414,737 A | 11/1983 | Menjo et al. |
| 4,441,931 A | 4/1984 | Levin |
| 4,476,157 A | 10/1984 | Shinozaki |
| 4,481,041 A | 11/1984 | Muller |
| 4,484,206 A | 11/1984 | Moroshima et al. |
| 4,518,981 A | 5/1985 | Schlupp |
| 4,607,270 A | 8/1986 | Iesaka |
| 4,638,551 A | 1/1987 | Einthoven |
| 4,691,435 A | 9/1987 | Anantha et al. |
| 4,692,991 A | 9/1987 | Flowers |
| 4,720,734 A | 1/1988 | Amemiya et al. |
| 4,738,937 A | 4/1988 | Parsons |
| 4,742,017 A | 5/1988 | Bredthauer |
| 4,742,377 A | 5/1988 | Einthoven |
| 4,762,806 A | 8/1988 | Suzuki et al. |
| 4,765,845 A | 8/1988 | Takada et al. |
| 4,769,686 A | 9/1988 | Horiuchi et al. |
| 4,816,879 A | 3/1989 | Ellwanger |
| 4,835,580 A | 5/1989 | Havemann et al. |
| 4,859,616 A | 8/1989 | Losehand et al. |
| 4,866,005 A | 9/1989 | Davis et al. |
| 4,875,083 A | 10/1989 | Palmour |
| 4,901,120 A | 2/1990 | Weaver et al. |
| 4,907,040 A | 3/1990 | Kobayashi et al. |
| 4,918,497 A | 4/1990 | Edmond |
| 4,942,440 A | 7/1990 | Baliga et al. |
| 4,946,803 A | 8/1990 | Ellwanger |
| 4,966,860 A | 10/1990 | Suzuki et al. |
| 4,980,749 A | 12/1990 | Ohtsuka et al. |
| 4,982,243 A | 1/1991 | Nakahata et al. |
| 4,982,260 A | 1/1991 | Chang et al. |
| 4,990,994 A | 2/1991 | Furukawa et al. |
| 4,998,148 A | 3/1991 | Essaff |
| 5,006,483 A | 4/1991 | Ohtsuka et al. |
| 5,006,908 A | 4/1991 | Matsuoka et al. |
| 5,027,166 A | 6/1991 | Ohtsuka et al. |
| 5,075,740 A | 12/1991 | Ohtsuka et al. |
| 5,075,756 A | 12/1991 | Dutta |
| 5,081,510 A | 1/1992 | Ohtsuka et al. |
| 5,087,949 A | 2/1992 | Haitz |
| 5,101,244 A | 3/1992 | Mori et al. |
| 5,109,256 A | 4/1992 | De Long |
| 5,112,774 A | 5/1992 | Ohtsuka et al. |
| 5,132,749 A | 7/1992 | Nishibayashi et al. |
| 5,148,240 A | 9/1992 | Ohtsuka et al. |
| 5,158,909 A | 10/1992 | Ohtsuka et al. |
| 5,184,198 A | 2/1993 | Bartur |
| 5,219,769 A | 6/1993 | Yonehara et al. |
| 5,221,638 A | 6/1993 | Ohtsuka et al. |
| 5,225,359 A | 7/1993 | DeLong |
| 5,241,195 A | 8/1993 | Tu et al. |
| 5,247,533 A | 9/1993 | Okazaki et al. |
| 5,262,668 A | 11/1993 | Tu et al. |
| 5,262,669 A | 11/1993 | Wakatabe et al. |
| 5,270,252 A | 12/1993 | Papanicolaou |
| 5,278,443 A | 1/1994 | Mori et al. |
| 5,306,943 A | 4/1994 | Ariyoshi et al. |
| 5,371,400 A | 12/1994 | Sakurai |
| 5,418,185 A | 5/1995 | Todd et al. |
| 5,430,323 A | 7/1995 | Yamazaki et al. |
| 5,442,200 A | 8/1995 | Tischler |
| 5,471,072 A | 11/1995 | Papanicolaou |
| 5,478,764 A | 12/1995 | Inoue |
| 5,502,003 A | 3/1996 | Ogino et al. |
| 5,539,237 A | 7/1996 | Todd et al. |
| 5,583,348 A | 12/1996 | Sundaram |
| 5,612,232 A | 3/1997 | Thero et al. |
| 5,612,567 A | 3/1997 | Baliga |
| 5,614,755 A | 3/1997 | Hutter et al. |
| 5,652,437 A | 7/1997 | Harris |
| 5,654,208 A | 8/1997 | Harris et al. |
| 5,677,572 A | 10/1997 | Hung et al. |
| 5,696,025 A | 12/1997 | Violette et al. |
| 5,710,059 A | 1/1998 | Rottner |
| 5,712,502 A | 1/1998 | Mitlehner |
| 5,736,753 A | 4/1998 | Ohno et al. |
| 5,742,076 A | 4/1998 | Sridevan et al. |
| 5,750,264 A | 5/1998 | Ueno et al. |
| 5,760,466 A | 6/1998 | Masuri et al. |
| 5,763,905 A | 6/1998 | Harris |
| 5,779,924 A | 7/1998 | Krames et al. |
| 5,789,311 A | 8/1998 | Ueno et al. |
| 5,801,836 A | 9/1998 | Bakowski et al. |
| 5,831,287 A | 11/1998 | Bakowski et al. |
| 5,849,620 A | 12/1998 | Harris et al. |
| 5,877,515 A | 3/1999 | Ajit |
| 5,898,128 A | 4/1999 | Romero et al. |
| 5,902,117 A | 5/1999 | Rottner et al. |
| 5,907,179 A | 5/1999 | Losehand et al. |
| 5,914,500 A | 6/1999 | Bakowski et al. |
| 5,915,179 A | 6/1999 | Etou et al. |
| 5,930,133 A | 7/1999 | Morizuka |
| 5,932,894 A | 8/1999 | Bakowski et al. |
| 5,949,124 A | 9/1999 | Hadizad et al. |
| 5,949,672 A | 9/1999 | Bernet |
| 5,956,578 A | 9/1999 | Weitzel et al. |
| 5,967,795 A | 10/1999 | Bakowsky et al. |
| 5,977,603 A | 11/1999 | Ishikawa |
| 5,977,605 A | 11/1999 | Bakowsky et al. |
| 5,982,015 A | 11/1999 | Hirayama et al. |
| 5,994,187 A | 11/1999 | Okabe et al. |
| 5,994,189 A | 11/1999 | Akiyama |
| 5,999,387 A | 12/1999 | Roesch et al. |
| 6,002,148 A | 12/1999 | Weitzel et al. |
| 6,002,159 A | 12/1999 | Bakowski et al. |
| 6,005,261 A | 12/1999 | Konstantinov |
| 6,021,036 A | 2/2000 | Bijlenga et al. |
| 6,023,110 A | 2/2000 | Henrion et al. |
| 6,040,237 A | 3/2000 | Bakowski et al. |
| 6,043,536 A | 3/2000 | Numata et al. |
| 6,046,465 A | 4/2000 | Wang et al. |
| 6,049,447 A | 4/2000 | Roesch et al. |
| 6,049,578 A | 4/2000 | Senechal et al. |
| 6,054,752 A | 4/2000 | Hara et al. |
| 6,055,148 A | 4/2000 | Grover |
| 6,066,884 A | 5/2000 | Krutsick |
| 6,078,090 A | 6/2000 | Williamson et al. |
| 6,083,814 A | 7/2000 | Nilsson et al. |
| 6,091,085 A | 7/2000 | Lester |
| 6,096,618 A | 8/2000 | Dunn et al. |
| 6,097,039 A | 8/2000 | Peters et al. |
| 6,100,104 A | 8/2000 | Haerle |
| 6,100,111 A | 8/2000 | Konstantinov |
| 6,104,043 A | 8/2000 | Hermansson et al. |
| 6,107,168 A | 8/2000 | Rupp |
| 6,110,813 A | 8/2000 | Ota et al. |
| 6,111,273 A | 8/2000 | Kawai |
| 6,121,637 A | 9/2000 | Isokawa et al. |
| 6,133,589 A | 10/2000 | Krames et al. |
| 6,133,617 A | 10/2000 | Hirayama et al. |
| 6,139,624 A | 10/2000 | Rupp |
| 6,169,294 B1 | 1/2001 | Biing-Jye et al. |
| 6,171,959 B1 | 1/2001 | Nagabushnam |
| 6,177,712 B1 | 1/2001 | Miyasaka |
| 6,178,077 B1 | 1/2001 | Kaluza et al. |
| 6,180,991 B1 | 1/2001 | Yamazaki |
| 6,184,545 B1 | 2/2001 | Werner et al. |
| 6,191,015 B1 | 2/2001 | Losehand et al. |
| 6,204,545 B1 | 3/2001 | Nakata |
| 6,214,107 B1 | 4/2001 | Kitabatake |
| 6,218,222 B1 | 4/2001 | Brown et al. |
| 6,225,653 B1 | 5/2001 | Igel et al. |
| 6,313,482 B1 | 11/2001 | Baliga |
| 6,320,205 B1 | 11/2001 | Pfirsch et al. |
| 6,445,054 B1 | 9/2002 | Traijkovic et al. |

(56) References Cited

U.S. PATENT DOCUMENTS

| | | | |
|---|---|---|---|
| 6,573,128 | B1 | 6/2003 | Singh |
| 6,590,240 | B1 | 7/2003 | Lanois |
| 6,800,897 | B2 * | 10/2004 | Baliga ........................... 257/328 |
| 6,831,345 | B2 | 12/2004 | Kinoshita et al. |
| 7,183,575 | B2 | 2/2007 | Shimoida et al. |
| 2002/0125482 | A1 | 9/2002 | Friedricks et al. |
| 2003/0020133 | A1 | 1/2003 | Dahlqvist et al. |
| 2004/0135153 | A1 | 7/2004 | Ryu et al. |
| 2006/0022292 | A1 * | 2/2006 | Shenoy ......................... 257/472 |

FOREIGN PATENT DOCUMENTS

| | | |
|---|---|---|
| EP | 0 961 328 | 12/1999 |
| EP | 1 076 363 | 2/2001 |
| EP | 1111688 | 6/2001 |
| GB | 2 346 480 | 8/2000 |
| JP | 56-131977 | 10/1981 |
| JP | 58-148469 | 3/1983 |
| JP | 62-279672 | 6/1988 |
| JP | 63-133569 | 6/1988 |
| JP | 1-225377 | 9/1989 |
| JP | 3147331 | 6/1991 |
| JP | 9-82587 | 3/1997 |
| JP | 10-256604 | 9/1998 |
| JP | 10233515 A | 9/1998 |
| JP | 2000-195827 | 7/2000 |
| JP | 2000252478 A | 9/2000 |
| JP | 2000349304 A | 12/2000 |
| JP | 2001085704 | 3/2001 |
| JP | 2001094095 A | 4/2001 |
| JP | 2002261295 A | 9/2002 |
| JP | 2003101039 A | 4/2003 |
| JP | A-2003-318388 | 11/2003 |
| WO | WO 96/03774 | 2/1996 |
| WO | WO 97/08754 | 3/1997 |
| WO | WO 01/11693 | 2/2001 |

OTHER PUBLICATIONS

Machine translation of Saito et al., JP 2001085704 A.*
Sze, "Physics of Semiconductor Devices", 1981, John Wiley & Sons, inc., 2nd ed., pp. 304-305.*
Tone et al. (2001) "4H-SiC junction barrier Schottky diodes with high forward current densities" *Semiconductor Science and Technology* 16, 594-597.
International Search Report and Written Opinion for International Application No. PCT/US2006/018260, mailed Nov. 24, 2006.
Annex to form PCT/ISA/206, Communication Relating to the Results of the Partial International Search; Date of mailing; Sep. 18, 2006.
Zimmerman et al. "Decision-making and the Vulnerability of Interdependent Critical Infrastructure" *IEEE International Conference on Systems, Man and Cybernetics* 4059-4063 (2004).
Anikin, M.M. et al. "Electrostatic properties of SiC-6H structures with an abrupt pin junction," *Soviet Physics Semiconductors*. Jan. 1988, vol. 22(1): pp. 80-83.
Appels et al. "High-voltage thin layer devices (RESURF devices)," *IEDM Tech. Dig.*, 1979, pp. 238-241.
Dahlquist et al. "A 2.8kV, Forward Drop JBS Diode with Low Leakage" *Materials Science Forum* 338-342: 1179-1182 (2000).
Edmond, J.A., J. Ryu, J.T. Glass, and R.F. Davis. "Electrical Contacts to Beta Silicon Carbide Thin Films." *Journal of the Electromechanical Society*. vol. 135, No. 2, Feb. 1988, pp. 359-362.
Glover, G.H. "Charge Multiplication in Au-SiC (6H) Schottky Junctions." *Journal of Applied Physics*. Nov. 1975, vol. 46, No. 11: pp. 4842-4844.
Hatakeyama et al. "Process and Device Simulation of a SiC Floating Junction Schottky Barrier Diode (Super-SBD)" *Materials Science Forum* 483-485: 921-954 (2005).
International Search Report and Written Opinion of the International Searching Authority for International patent application No. PCT/US2004/001183 mailed on Jul. 7, 2004.
Ioannou et al. "The Effect of Heat Treatment on Au Schottky Contacts on β-SiC." *IEEE Transactions on Electron Devices*. Aug. 1979, vol. Ed-34, No. 8: pp. 1694-1699.
Ioannou, D.E. and N.A. Papanicolaou. "Deep Level Transient Spectroscopy of β-SiC Layers." *Abstracts*. Fourth National Review Meeting on Growth and Characterization of SiC and Its Employment in Semiconductor Applications.
Katsunori Ueno, Tatsue Urushidani, Kouichi Hahimoto, and Yasukazu Seki. "The Guard-Ring Termination for the High-Voltage SiC Schottky Barrier Diodes." *IEEE Electron Device Letters*. vol. 16. No. 7, Jul. 1995.
Kinoshita et al. "Guard Ring Assisted RESURF: A New Termination Structure Providing Stable and High Breakdown Voltage for SiC Power Devices" *Technology Digest of ISPSD* pp. 253-256 (2002).
Konstantinov, A.O. "Ionization Rates and Critical Fields in 4H Silicon Carbide," *Appl. Phys. Lett.* vol. 71, No. 1, Jul. 1997, pp. 90-92.
Kosiachenko, L.A. and E.F. Kukhta, V.M. Skiliarchuk, "Light Emission from Metal at Forward Bias of a Shottky Diode," *Zhurnal tekhnicheskoi fiziki* [*Journal of Technical Physics*], vol. 54, No. 6, 1984.
Kyoritsu Shuppan Kabushiki Kaisha, *Crystallography Handbook*.
Lendenmann et al. "Degradation in SiC Bipolar Dvices: Sources and Consequences of Electrically Active Dislocations in SiC" *Materials Science Forum* 433-436: 901-906 (2002).
Li et al. "Theoretical and Experimental Study of 4H-SiC Junction Edge Termination," *Materials Science Forum*, vols. 338-342 (2000), pp. 1375-1378.
Merchant et al. "Realization of High Breakdown Voltage (>700V) in Thin SOI Devices," *Tech. Digest of ISPSD* '91, pp. 31-34.
Onose et al. "Over 2000 V FLR Termination Technologies for SiC High Voltage Devices" 12$^{th}$ International Symposium on Power Semiconductor Devices and IC's, Toulousee, France (2000).
Pelletier, J., D. Gervais, and C. Pomot. "Application of Wide Gap Semiconductors to Surface Ionization: Work Functions of AlN and SiC Crystals." *Journal of Applied Physics*. vol. 55, No. 4. Feb. 15, 1984, pp. 994-1002.
Powell, J.A. "Silicon Carbide: Progress in Crystal Growth." *Material Research Society Symposium Proceedings*. 1987, vol. 97: pp. 159-168.
Singh, R. and J.W. Palmour, "Planar Terminations in 4H-SiC Schottky Diodes with Low Leakage and High Yields," *IEEE International Symposium on Power Semiconductor Devices and ICs*, 1997.
Streetman, B.G. *Solid State Electronic Devices*. Second Edition, Prentice-Hall, 1980, pp. 192-193, 201, 443.
Sze, S.M. *Physics of Semiconductor Devices*, John Wiley & Sons, p. 250-254.
*The Electrical Engineering Handbook*, Richard C. Dorf, editor, Second Edition, CRC/IEEE Press.
Violin, E.E., et al. "Light Emitting Devices Based on Silicon Carbide." *Silicon Carbide*. 1973, p. 565. (edited by Marshall, Faust, Ryan).
Waldrop, J.R. and R.W. Grant. "Formation and Schottky barrier height of metal contacts to β-SiC." *Applied Physics Letters*. vol. 56, No. 6, Feb. 5, 1990, pp. 557-559.
Yilmaz, Hamza, "Optimization and Surface Charge Sensitivity, of High Voltage Blocking Structures with Shallow Junctions," *IEEE Transactions on Electron Devices*, vol. 38, No. 3, Jul. 1991, pp. 1666-1675.
Zhu et al. "1kV 4H-SiC JBS Rectifiers Fabricated using an AlN Capped Anneal" *Materials Science Forum* 433-436: 843-846 (2003).
Saidov, M.S., Kh. A. Shamuratov, and A. Umurzakov. "Current-voltage characteristics of silicon carbide heterojunctions." *Soviet Physics of Semiconductors*. vol. 13, No. 9, Sep. 1979, pp. 1054-1056.
Translation of Chinese Office Action for corresponding Application No. 200680035439.3 dated Mar. 13, 2009.
Translation of Office Action for corresponding JP application No. 2008-511363 mailed Aug. 9, 2011.
Office Action, Japanese Patent Application No. 2012-002273 and English translation, Sep. 3, 2012, 5 pages.

* cited by examiner

10A/div

1V/div

SILICON CARBIDE JUNCTION BARRIER SCHOTTKY DIODES WITH SUPPRESSED MINORITY CARRIER INJECTION

FIELD OF THE INVENTION

The present invention relates to semiconductor devices and, more particularly, to diodes.

BACKGROUND

High voltage silicon carbide (SiC) Schottky diodes, which can handle voltages between, for example, about 600V and about 2.5 kV may handle as much as about 100 amps or more of current, depending on their active area. High voltage Schottky diodes have a number of important applications, particularly in the field of power conditioning, distribution and control.

An important characteristic of a SiC Schottky diode in such applications is its switching speed. Silicon-based PIN devices typically exhibit relatively poor switching speeds. A silicon PIN diode may have a maximum switching speed of approximately 20 kHz, depending on its voltage rating. In contrast, silicon carbide-based Schottky devices are theoretically capable of much higher switching speeds, for example, in excess of about 100 times better than silicon. In addition, silicon carbide devices may be capable of handling a higher current density than silicon devices.

Schottky barrier diodes in 4H-SiC may have a very low specific on-resistance and very fast turn-off characteristics. Attempts to improve device performance have included integrating a $p^+n$ junction grid within the Schottky diode, forming a Junction-Barrier Schottky (JBS) structure. When a forward bias is applied, Schottky regions of the diode conduct. As long as the applied forward bias is less than the built-in junction potential of the $p^+n$ junction, only majority carrier current flows and no minority carriers are injected into the drift layer, resulting in negligible reverse recovery time due to stored minority carrier charge. When a reverse bias is applied, depletion regions of the p+ regions shield the Schottky regions, resulting in lower electric field at the Schottky metal-SiC interface. This effect may reduce or minimize the reverse bias leakage current from the Schottky areas of the diode and may allow fabrication of high voltage, low leakage and high temperature diodes. The on-state voltage drop of the device is determined by the metal-SiC barrier height, resistance of the drift region and the relative area of the Schottky and the p+ implanted regions.

When a forward bias greater than the built-in potential of the $p^+n$ junction is applied, which is 2.6 V in 4H-SiC, the built-in pn junction turns on. Holes are injected from the p+ implanted regions and electrons are injected from the n+ regions. An exemplary I-V curve illustrating the possible I-V characteristics of a conventional JBS diode is provided in FIG. 1. For example, a 4H-SiC JBS diode with Ti Schottky metal will show majority carrier conduction at approximately 1V. Thus, the Schottky turn-on point in FIG. 1 may be at about 1V of forward bias. If the contact to the junction barrier grid is sufficiently ohmic, when the majority carrier current increases with forward bias the pn junction may turn on at about 2.6 V. From this point, the minority carrier current dominates the forward conduction of the diode. Since the drift layer of the diode is flooded with carriers, the device may show significant reverse recovery charge and reverse recovery time. Thus, when such a device is switched from the forward bias (conducting) state to the reverse bias (blocking) state, it would undesirably continue to conduct current until all injected minority carriers have recombined. In addition, carrier recombination can cause propagation of stacking faults, which may result in severe degradation of the I-V characteristics.

A conventional SiC Schottky diode with an implanted junction barrier grid is illustrated in FIG. 2. In the conventional device, floating field rings surround the junction barrier grid. A non-scale simplified illustration of the cross-section structure of the conventional device is seen below in FIG. 2. In FIG. 2, the number of implant regions in the junction barrier region have been reduced for clarity. Furthermore, the relative dimensions of regions have also been altered for clarity.

As seen in FIG. 2, the conventional device includes a relatively thin (about 0.5 µm) n+ SiC epitaxial layer 12 on an n+ SiC substrate 10. An n– SiC epitaxial layer 14 is provided on the n+ SiC epitaxial layer 12. The n– SiC epitaxial layer 14 is about 5 µm thick for 600V products and about 13 µm thick for 1200V products. Implanted regions of p-type SiC 16 are provided in the n– SiC epitaxial layer 14 and extend to a depth of about 0.5 µm. The p-type implants 16 provide the junction barrier grid and the floating field rings. An oxide layer that includes a first thermal oxide layer 18 and a second deposited oxide layer 20 is provided on the floating field rings and on the outer portion of the junction barrier grid. A Schottky contact 22 is provided on the junction barrier grid and extends onto the oxide layer. An ohmic contact 24 is provided on the SiC substrate 10.

All of the p-type implants (the junction barrier grid and the field rings) of the conventional devices are implanted with the same dose so as to result in a carrier concentration of greater than $1\times10^{18}$ cm$^{-3}$ after activation. The junction barrier grid includes a grid of p-type implanted regions that are about 1.5 µm wide and spaced apart about 4 µm. This portion of the junction barrier grid includes uniform sized and spaced implants and is surrounded by the periphery p-type implanted region that is about 15 µm wide and connects the uniformly sized implant regions to each other. This periphery region of the junction barrier grid is made wider than the other portions to allow for manufacturing variation so as to assure that the Schottky contact will contact the grid around the entire periphery of the grid. The p-type implanted floating field rings are about 2.75 µm wide and are spaced apart about 1.75 µm.

In manufacturing the conventional devices, an n+ SiC substrate 10 is provided. Two n-type SiC epitaxial layers (an n+ SiC epitaxial layer 12 and an n– SiC epitaxial layer 14) are formed on the substrate 10 as described above with reference to FIG. 2. The SiC epitaxial layers and the SiC substrate are thermally oxidized to provide a sacrificial layer of silicon dioxide on the SiC substrate and the epitaxial layers. Each of these sacrificial layers of silicon dioxide is removed by etching. P-type dopants (Al) are implanted into the n– SiC epitaxial layer at a dose of $4\times10^{14}$ cm$^{-2}$ to provide the floating guard rings and the junction barrier grid as illustrated in FIG. 2. The implanted p-type dopants are then activated utilizing a high temperature anneal (i.e. 1600° C.). The high temperature anneal incorporates the dopants into the crystal structure of the SiC and removes most (e.g. ≥90%) if not all of the crystal defects that resulted from the implantation process.

A sacrificial oxide is then thermally grown on the n– SiC epitaxial layer, including the implanted regions, and removed by etching. A thermal oxide is then grown on the n– SiC epitaxial layer and a deposited oxide is formed and densified on the thermal oxide. The oxides on the n– SiC epitaxial layer are then patterned to provide an opening to the n– SiC epitaxial layer for a Schottky contact and the Schottky contact is formed in the opening to contact the n– SiC epitaxial layer and the implanted junction barrier grid. The Schottky contact also extends onto the oxide layer as shown in FIG. 2.

Additional conventional terminations of SiC Schottky diodes are described in "Planar Terminations in 4H-SiC Schottky Diodes With Low Leakage And High Yields" by Singh et al., ISPSD '97, pp. 157-160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331-332. Additionally, other termination techniques are described in published PCT Application No. WO 97/08754 entitled "SiC Semiconductor Device Comprising A PN Junction With A Voltage Absorbing Edge."

SUMMARY OF THE INVENTION

Some embodiments of the present invention provide silicon carbide Schottky diodes and methods of fabricating silicon carbide Schottky diodes that include a silicon carbide junction barrier region disposed within a drift region of the diode. The junction barrier region includes a first region of silicon carbide having a first doping concentration in the drift region of the diode and a second region of silicon carbide in the drift region and disposed between the first region of silicon carbide and a Schottky contact of the Schottky diode. The second region is in contact with the first region of silicon carbide and the Schottky contact. The second region of silicon carbide has a second doping concentration that is less than the first doping concentration and forms a Schottky rectifying junction with the Schottky contact.

In further embodiments of the present invention, the drift region comprises n-type silicon carbide and the first and second regions comprise p-type silicon carbide. In particular embodiments of the present invention, the second region of silicon carbide extends into the drift region from about 0.01 to about 0.5 µm and the first region of silicon carbide extends into the drift region from about 0.1 to about 1 µm. The second region of silicon carbide may have a surface doping concentration of from about $1 \times 10^{15}$ cm$^{-3}$ to about $5 \times 10^{18}$ cm$^{-3}$.

In additional embodiments of the present invention, the drift region includes an n-type silicon carbide epitaxial layer. An n-type silicon carbide substrate having a carrier concentration greater than the carrier concentration of the first n-type silicon carbide epitaxial layer may also be provided, and the first n-type silicon carbide epitaxial layer may be disposed on the n-type silicon carbide substrate. A second n-type silicon carbide epitaxial layer may be disposed between the first silicon carbide epitaxial layer and the n-type silicon carbide substrate. The second n-type silicon carbide epitaxial layer may have a higher carrier concentration that the first n-type silicon carbide epitaxial layer. An ohmic contact may be provided on the silicon carbide substrate opposite the first n-type silicon carbide epitaxial layer. A plurality of floating field rings may also be provided surrounding the silicon carbide junction barrier region.

Some embodiments of the present invention provide silicon carbide junction barrier Schottky (JBS) diodes and methods of fabricating silicon carbide JBS diodes that include a silicon carbide junction barrier region disposed in a silicon carbide drift region, the junction barrier region providing a built-in pn junction and means, integral to the diode, for blocking current conduction of the built-in pn junction of the junction barrier region.

In particular embodiments of the present invention, the means, integral to the diode, for blocking current conduction of the built-in pn junction of the junction barrier region is provided by a Schottky diode in series between the built-in pn junction of the junction barrier region and a Schottky contact of the JBS diode. The Schottky diode is reverse biased when the built-in pn junction is forward biased.

In further embodiments of the present invention, the Schottky diode is provided by a Schottky junction between the Schottky contact and the junction barrier region. The Schottky junction is configured to be sufficiently rectifying to block current through the built-in pn junction when the JBS diode is forward biased.

In particular embodiments of the present invention, the junction barrier region comprises p-type silicon carbide regions in an n-type silicon carbide drift region. The p-type silicon carbide regions may have a surface doping concentration of from about $1 \times 10^{15}$ cm$^{-3}$ to about $5 \times 10^{18}$ cm$^{-3}$. The p-type silicon carbide regions may have a higher doping concentration at a depth below the surface of the p-type silicon carbide regions than at the surface of the p-type silicon carbide regions.

In some embodiments of the present invention, the p-type silicon carbide regions include a first region of p-type silicon carbide having a first doping concentration in the n-type drift region of the diode and a second region of p-type silicon carbide in the n-type drift region and disposed between the first region of p-type silicon carbide and a Schottky contact of the JBS diode. The second region of p-type silicon carbide is in contact with the first region of p-type silicon carbide and the Schottky contact. The second region of p-type silicon carbide has a second doping concentration that is less than the first doping concentration and forming a Schottky rectifying junction with the Schottky contact.

In further embodiments of the present invention, the silicon carbide JBS diode further includes a Schottky contact on the silicon carbide drift region and the means, integral to the diode, for blocking current conduction of the built-in pn junction of the junction barrier region comprises a series resistance between the built-in pn junction of the junction barrier region and the Schottky contact of the JBS diode. The series resistance is provided by a first region of p-type silicon carbide having a first doping concentration in the n-type drift region of the diode and a second region of p-type silicon carbide in the n-type drift region disposed between the first region of p-type silicon carbide and the Schottky contact of the JBS diode and in electrical contact with the first region of p-type silicon carbide and the Schottky contact. The second region of p-type silicon carbide has a second doping concentration that is less than the first doping concentration and forming a resistive contact with the Schottky contact.

In additional embodiments of the present invention, the silicon carbide JBS diode further includes a Schottky contact on the silicon carbide drift region and the means, integral to the diode, for blocking current conduction of the built-in pn junction of the junction barrier region comprises an insulator layer disposed between the junction barrier region and the Schottky contact of the JBS diode.

Some embodiments of the present invention provide silicon carbide Schottky diodes and methods of fabrication silicon carbide Schottky diodes that include a silicon carbide drift region, a Schottky contact on the silicon carbide drift region and a silicon carbide junction barrier region disposed within the silicon carbide drift region of the diode. The junction barrier region comprises a first implanted region of silicon carbide in the drift region of the diode and having a first peak carrier concentration and a second implanted region of silicon carbide in the drift region and disposed between the first region of silicon carbide and the Schottky contact of the Schottky diode and in electrical contact with the first region of silicon carbide and the Schottky contact. The second region of silicon carbide has a second peak carrier concentration that is less than the first peak carrier concentration.

In some embodiments, the second region of silicon carbide may provide a resistive junction to the Schottky contact. In other embodiments, the second region of silicon carbide may provide a Schottky junction to the Schottky contact.

In additional embodiments of the present invention, the drift region comprises n-type silicon carbide and the first and second regions comprise p-type silicon carbide. The second region of silicon carbide may extend into the drift region from about 0.01 to about 0.5 µm and the first region of silicon carbide may extend into the drift region from about 0.1 to about 1 µm. In particular embodiments of the present invention, the second region of silicon carbide has a surface doping concentration of from about $1 \times 10^{15}$ cm$^{-3}$ to about $5 \times 10^{18}$ cm$^{-3}$.

In further embodiments of the present invention, the drift region comprises a first n-type silicon carbide epitaxial layer. An n-type silicon carbide substrate having a carrier concentration greater than the carrier concentration of the first n-type silicon carbide epitaxial layer may also be provided. The first n-type silicon carbide epitaxial layer may be disposed on the n-type silicon carbide substrate.

In still further embodiments of the present invention, a second n-type silicon carbide epitaxial layer is provided disposed between the first silicon carbide epitaxial layer and the n-type silicon carbide substrate. The second n-type silicon carbide epitaxial layer has a higher carrier concentration that the first n-type silicon carbide epitaxial layer.

In additional embodiments of the present invention, an ohmic contact is provided on the silicon carbide substrate opposite the first n-type silicon carbide epitaxial layer. A plurality of floating field rings may also be provided surrounding silicon carbide junction barrier region.

Some embodiments of the present invention provide silicon carbide Schottky diodes and methods of fabricating silicon carbide Schottky diodes that include a silicon carbide drift region, a Schottky contact on the silicon carbide drift region, a silicon carbide junction barrier region disposed within the silicon carbide drift region of the diode, the junction barrier region and an insulator layer disposed between the silicon carbide junction barrier region and the Schottky contact.

DETAILED DESCRIPTION OF EMBODIMENTS OF THE INVENTION

Figure 1:
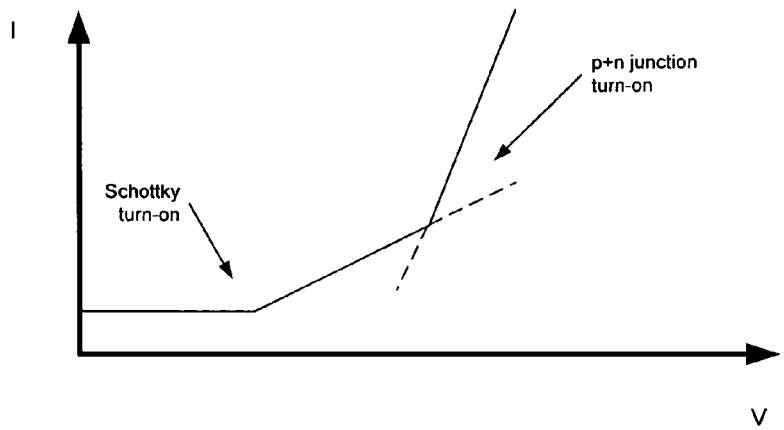
FIG. 1 is an exemplary I-V curve of a conventional JBS diode.
Figure 2:
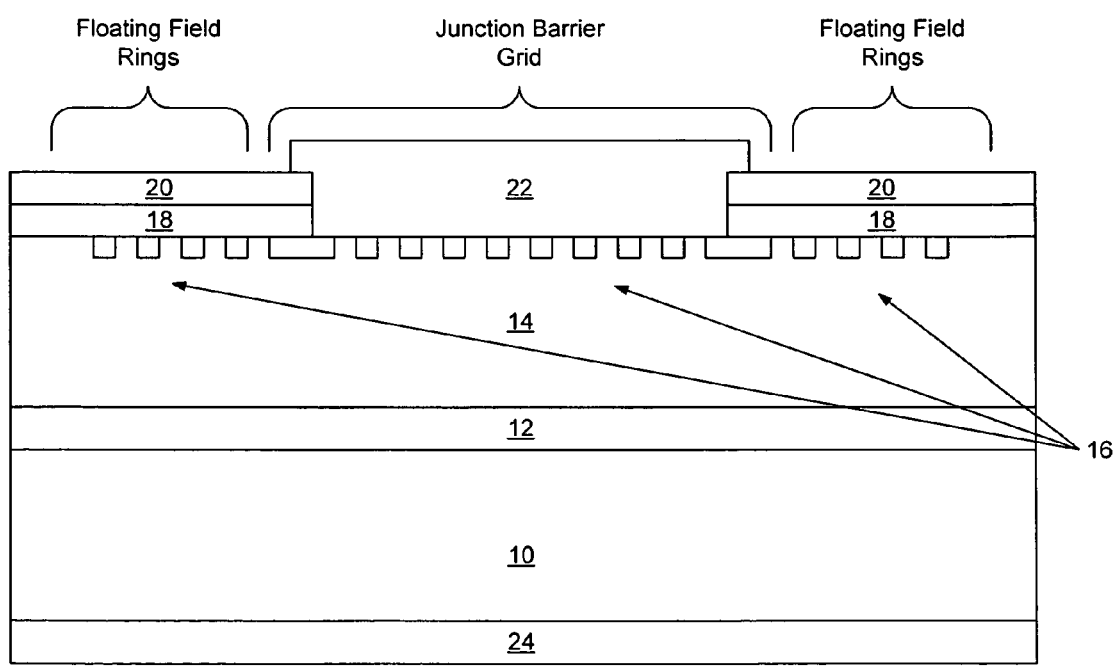
FIG. 2 is a cross-sectional diagram of a conventional SiC junction barrier Schottky diode.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Embodiments of the present invention provide integral structures that block the current conduction of the built-in PiN diode in the JBS structure. As used herein, an integral structure is one that is formed in and/or on the semiconductor materials that provide the Schottky diode. In some embodiments of the present invention, this is achieved by incorporating a Schottky diode in series with the PiN diode, where the Schottky diode is of opposite direction to that of the PiN diode.

Figure 3:
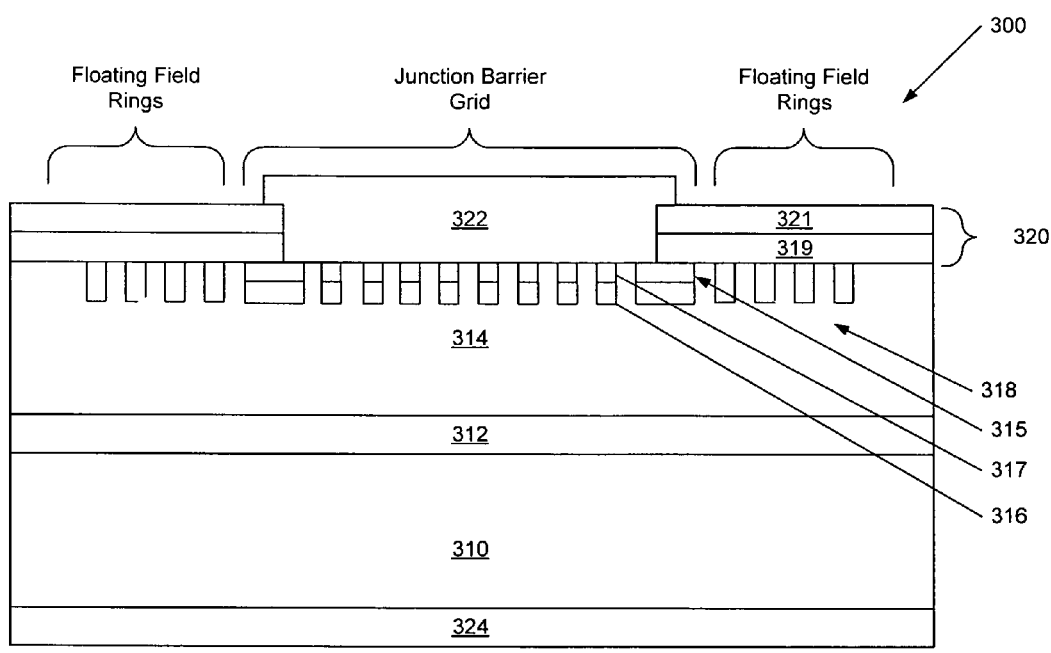
FIG. 3 is a cross-sectional diagram of SiC junction barrier Schottky diodes according to some embodiments of the present invention.

Exemplary devices according to some embodiments of the present invention are schematically illustrated in FIG. 3. However, embodiments of the present invention should not be construed as limited to the particular exemplary embodiments described herein but may include any suitable structure that provides diodes having the characteristics described herein.

Turning to FIG. 3, a Schottky diode 300 according to some embodiments of the present invention includes a silicon carbide (SiC) substrate 310. The substrate 310 may be an n+ SiC substrate. Suitable substrates are available from Cree, Inc. of Durham, N.C. In particular embodiments of the present invention, the substrate 310 is a 4H SiC substrate, although other polytypes may be utilized. In some embodiments of the present invention, the doping concentration of the substrate 310 may be at least about $1 \times 10^{18}$ cm$^{-3}$.

Optionally, a first silicon carbide epitaxial layer 312 may be provided on the substrate 310 between the substrate 210 and a second silicon carbide epitaxial layer 314 that provides the drift region of the device. In some embodiments of the present invention, the first silicon carbide epitaxial layer 312 may be a relatively thin (about 0.5 μm) n+ SiC epitaxial layer. In some embodiments of the present invention, the doping concentration of the first silicon carbide epitaxial layer 312 may be at least about $1 \times 10^{18}$ cm$^{-3}$. Techniques for forming epitaxial silicon carbide layers are known to those of skill in the art and need not be described further herein.

A second silicon carbide epitaxial layer 314 is provided on the first silicon carbide epitaxial layer 312. In some embodiments, of the present invention, the second silicon carbide epitaxial layer is an n− SiC epitaxial layer that provides the drift region of the diode 300. In some embodiments of the present invention, the second silicon carbide epitaxial layer 314 comprises n-type silicon carbide with a doping concentration of from about $1 \times 10^{15}$ cm$^{-3}$ to about $1 \times 10^{17}$ cm$^{-3}$ and has a thickness of from about 2 μm to about 20 μm. In particular embodiments of the present invention, the n− SiC epitaxial layer 314 is about 5 μm thick for 600V products and about 13 μm thick for 1200V products.

First and second silicon carbide regions 316 and 317 of opposite conductivity type to the drift region are provided in the second silicon carbide epitaxial layer 314 to provide a junction barrier region. In some embodiments of the present invention, the junction barrier region is provided as a junction barrier grid. Exemplary embodiments of the present invention will be described with reference to a junction barrier grid, however, the junction barrier region should not be construed as limited to a grid configuration. In particular embodiments of the present invention, the silicon carbide regions 316 and 317 are p-type silicon carbide. Optionally, p-type silicon carbide regions 318 may also be provided in the in the second silicon carbide epitaxial layer 314 to provide floating field rings. The first silicon carbide regions 316 may extend to a depth of from about 0.1 to about 1 μm from the surface and, in some embodiments to a depth of about 0.5 μm into the second silicon carbide epitaxial layer 314. The second silicon carbide regions 317 may extend to a depth of from about 0.01 to about 0.5 μm from the surface and, in some embodiments to a depth of about 0.2 μm into the second silicon carbide epitaxial layer 314. The depth of the second silicon carbide regions 317 should be sufficiently deep to allow for formation of a quality Schottky contact to the second silicon carbide regions 317 but not so deep as to substantially reduce the blocking capabilities provided by the depletion regions surrounding the first silicon carbide regions 316 when the diode 300 is reverse biased.

The first and second regions of silicon carbide 316 and 317 provide the junction barrier grid. Third regions of silicon carbide may also be provided to provide floating field ring regions 318. An oxide layer 320, that may include a first thermal oxide layer 319 and a second deposited oxide layer 321 may be provided on the floating field ring regions 318 and on the outer portion of the junction barrier grid as illustrated in FIG. 3. A Schottky contact 322 is provided on the junction barrier grid and may extend onto the oxide layer 320. An ohmic contact 324 is provided on the SiC substrate 310.

The first regions of silicon carbide 316 may be implanted with a doping concentration of from about $1 \times 10^{19}$ to about $1 \times 10^{21}$ cm$^{-3}$ and which result in a carrier concentration of greater than $1 \times 10^{18}$ cm$^{-3}$ after activation. The second regions of silicon carbide 317 are implanted with a lower doping concentration than the first regions of silicon carbide 316, for example, from about $1 \times 10^{15}$ cm$^{-3}$ to about $5 \times 10^{18}$ cm$^{-3}$, that provides a carrier concentration of about $1 \times 10^{17}$ cm$^{-3}$ or less after activation. The total dose of the p-type implant in the first and second regions 316 and 317 should be great enough so that the first and second regions 316 and 317 do not fully deplete when the diode 300 is reverse biased.

Some embodiments of the present invention provide for at least two implanted regions that have differing implant doses. The implant dose refers to the peak concentration for an implanted region. Such regions may be distinguished from the variation in dopant concentration that may naturally result from implanting in a buried region of silicon carbide. Thus, as used herein, implanted regions with different implant doses refers to regions that are provided by at least two implantation steps with different implant energies and different implant doses, where the dose differs by more than a difference that compensates for the different implant energies.

The floating field ring regions 318 may be implanted with a doping concentration of from about $1 \times 10^{19}$ to about $1 \times 10^{21}$ cm$^{-3}$ and which result in a carrier concentration of greater than $1 \times 10^{18}$ cm$^{-3}$ after activation. While the floating field ring regions 318 are illustrated as single regions of substantially uniform doping concentration, they may be multiple regions of differing doping concentrations that, for example, may be formed at the same time as the junction barrier grid and, thus, may have the same doping profile as the first and second regions 316 and 317.

By providing the second silicon carbide regions 317, the surface concentration of the implanted junction barrier grid may be reduced so that a Shottky junction is provided to the second silicon carbide. The Schottky contact metal 322 to the epitaxial layer 314 can be used as the Schottky contact metal to the second silicon carbide regions 317. In contrast, in a conventional JBS diode in SiC such as those described above with reference to FIG. 1, when a substantially uniform doping is provided in the junction barrier grid, a poor quality ohmic contact is formed between the junction barrier grid and the Schottky contact. The poor quality ohmic contact does not provide a linear I-V curve as a high quality ohmic contact would provide but also does not provide the sharp knee in the I-V curve that is associated with reverse bias blocking of a Schottky diode. Thus, while the contact in conventional JBS diodes as described above with reference to FIG. 1 may not provide an ideal ohmic contact to the junction barrier grid, the contact provided typically does not provide sufficient blocking characteristics to prevent current flow through the built-in PiN diode. By reducing the doping concentration at the surface where the Schottky contact contacts the junction barrier grid, the formation of a Schottky contact to the junction barrier grid that provides the desired blocking characteristics to prevent current flow through the built-in PiN diode may be provided as described below with reference to FIG. 4C. By preventing current flow through the built-in PiN diode, minority carrier injection may be suppressed which may reduce reverse recovery charge and, thereby, reduce reverse recover time of the diode.

In some embodiments, the regions 316 and 317 of the junction barrier grid includes a grid of p-type implanted regions that are from about 0.5 to about 5 µm wide and spaced apart by from about 2 to about 10 µm. In particular embodiments, the grid of p-type implanted regions are about 1.5 µm wide and spaced apart about 4 µm. The p-type implants may be uniformly or non-uniformly spaced and may be of uniform or non-uniform sized or combinations of uniform or non-uniform spacing and uniform or non-uniform sizes.

Furthermore, as illustrated in FIG. 3, the junction barrier grid may be surrounded by a peripheral region 315 that is of a different size from the central portions of the junction barrier grid. Thus, in some embodiments of the present invention, the junction barrier grid may include uniform sized and spaced implants surrounded by a periphery p-type implanted region that connects the uniformly sized implants to each other. In some embodiments, the periphery implant may be from about 2 to about 30 µm wide and, in particular embodiments, is about 15 µm wide. This periphery region of the junction barrier grid may be made wider than the other portions to allow for manufacturing variation so as to assure that the Schottky contact will contact the grid around the entire periphery of the grid.

The number of regions in the junction barrier grid may vary based on the size of the active region of the device and the size and spacing of the regions 316 and 317 of the junction barrier grid. Accordingly, embodiments of the present invention are not limited to a particular size and spacing of the junction barrier regions as such may be device specific depending on the size of the device, doping, implant depth, etc. In general, however, the size and spacing of the regions 316 and 317 may fill the active region of the device and be selected to provide low on-state resistance and high reverse bias blocking voltage. The considerations in the selection of the size and spacing of the regions of a junction barrier grid are known to those of skill in the art and, therefore, need not be described further herein.

The implanted floating field rings 318 may be uniformly or non-uniformly sized and/or spaced. In some embodiments of the present invention, the floating field rings 318 are from about 1.0 µm to about 5.0 µm wide and are spaced apart from about 0.1 µm to about 5 µm. In particular embodiments, the floating field rings 318 are about 2.75 µm wide and are spaced apart about 1.75 µm. From about 1 to about 80 floating field rings 318 may be provided and, in some embodiments 4 floating field rings 318 are provided.

While embodiments of the present invention have been described with reference to floating field rings providing the edge termination of the device, other edge termination techniques may also be provided. Thus, in further embodiments of the present invention, the edge termination of the diode 300 may be provided as described in U.S. Pat. No. 6,573,128, entitled "Epitaxial Edge Termination for Silicon Carbide Schottky Devices and Methods of Fabricating Silicon Carbide Devices Incorporating Same" and/or United States Patent Publication No. US 2004-0135153 A1 entitled "Multiple floating guard ring edge termination for silicon carbide devices and methods of fabricating silicon carbide devices incorporating same," the disclosures of which are incorporated herein as if set forth in their entirety.

While embodiments of the present invention have been described with reference to the junction between the region 317 and the Schottky contact metal 322 forming a Schottky junction, in some embodiments of the present invention a highly resistive ohmic contact may be formed between the region 317 and the Schottky contact 322. Thus, in some embodiments of the present invention, minority carrier injection may be suppressed by increasing the resistance of the path through the p-type regions 317 and 318 such that either the p-n junction does not turn on or the path through the built-in p-n junction diode is not the dominant current conduction path.

Figure 4A:
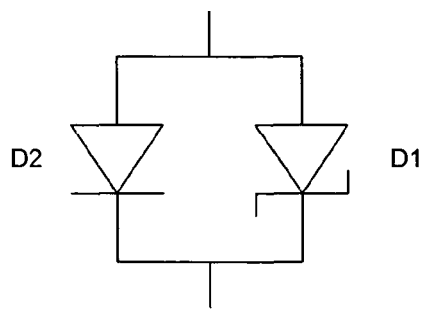
FIG. 4A is an equivalent circuit of a conventional JBS diode.
Figure 7:
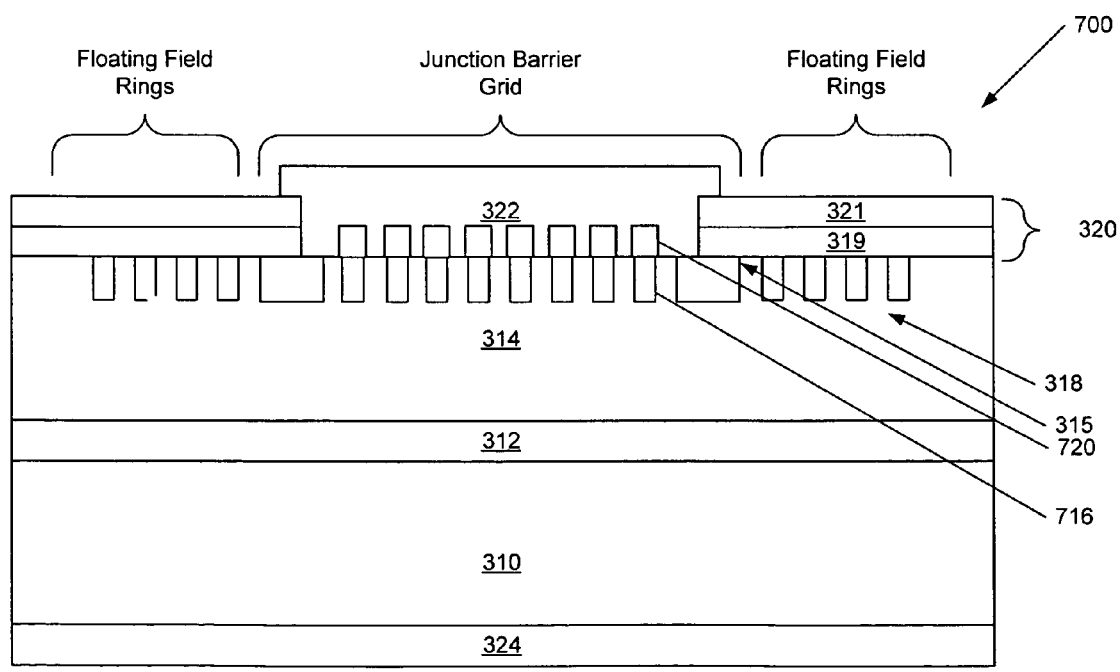
FIG. 7 is a cross-sectional diagram of SiC junction barrier Schottky diodes according to some embodiments of the present invention.

FIGS. 4A through 4E are schematic diagrams of equivalent circuits of a convention JBS diode (FIG. 4A) and a JBS diode according to embodiments of the present invention (FIGS. 4B through 4E), such as the JBS diode 300 of FIG. 3 and the JBS diode 700 of FIG. 7. As seen in FIG. 4A, a conventional JBS diode may be viewed as a Schottky diode D1 in parallel with a PiN diode D2. As discussed above, in 4H-SiC, when forward biased the Schottky diode D1 turns on at about 1.1 V and the PiN diode D2 may turn on at about 2.6 V and become the dominant current source of the device.

Figure 4B:
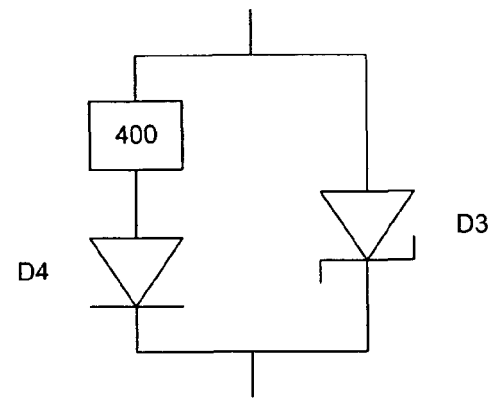
FIG. 4B is an equivalent circuit of a JBS diode according to embodiments of the present invention.

As seen in the equivalent circuit of FIG. 4B, embodiments of the present invention may provide an integral current blocking structure 400 in series with the PiN diode D4 and the series combination is in parallel to the Schottky diode D3 provided by the Schottky contact to the n-type drift region. When the diode D3 is forward biased, the blocking structure 400 blocks current flow through the PiN diode D4. When a reverse bias is applied to the structure, the diodes D3 and D4 will be in reverse bias. No current will flow through diode D3 and D4 because diode D4 is reverse biased, and the anodes of diodes D3 and D4 will be held very close to each other. Thus, the depletion region from diode D4 shields diode D3 as in a convention JBS diode.

Figure 4C:
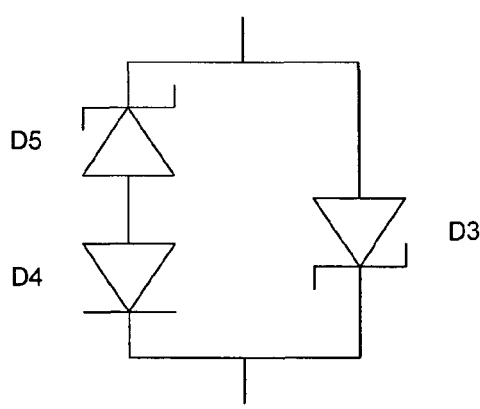
FIG. 4C is an equivalent circuit of a JBS diode according to embodiments of the present invention that provides a blocking Schottky junction.

As seen in the equivalent circuit of FIG. 4C, some embodiments of the present invention may provide a Schottky diode D5 as the current blocking structure 400 in series with the PiN diode D4 and the series combination is in parallel to the Schottky diode D3 provided by the Schottky contact to the n-type drift region. When the diode D3 is forward biased, the diode D5 is reverse biased and blocks current flow through the PiN diode D4. Current can flow through diode D4 only if diode D5 breaks down and goes into avalanche. This may require a very large forward bias. However, at such forward bias, the current density through diode D3 is very high, and the power dissipation may be much greater than the capability of the packages which may destroy the device. Thus, the breakdown of the diode D5 may not be the limiting factor in failure of the device and the built-in PiN junction diode D4 will not turn on.

When a reverse bias is applied to the structure, the diodes D3 and D4 will be in reverse bias, and the diode D5 will be in forward bias. No current will flow through diode D3 and D4 because diode D4 is reverse biased, and the anodes of diodes D3 and D4 will be held very close to each other. Thus, the depletion region from diode D4 shields diode D3 as in a convention JBS diode.

Thus, embodiments of the present invention may provide structures that block the current conduction in the built-in PiN diode in the JBS structure. For example, the Schottky diode D5, that may be provided by forming a Schottky contact to the implanted regions of the junction barrier grid, may provide means, integral to the diode, for blocking current conduction of the built-in pn junction of the junction barrier grid.

Figure 4D:
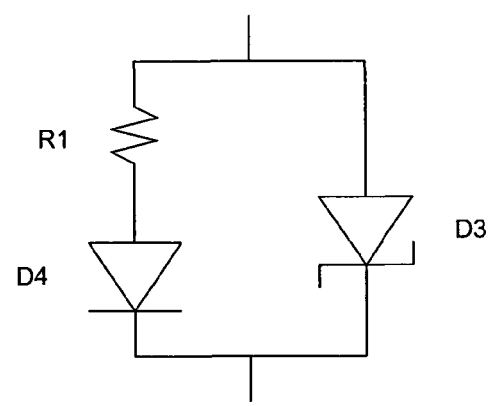
FIG. 4D is an equivalent circuit of a JBS diode according to embodiments of the present invention that provides a highly resistive junction.

As seen in the equivalent circuit of FIG. 4D, some embodiments of the present invention may provide a series resistance R1 as the current blocking structure 400 in series with the PiN diode D4 and the series combination is in parallel to the Schottky diode D3 provided by the Schottky contact to the n-type drift region. When the diode D3 is forward biased, the series resistance R1 increases the resistance of the current conduction path through the diode D4 and blocks current now through the PiN diode D4. When a reverse bias is applied to the structure, the diodes D3 and D4 will be in reverse bias. No current will flow through diode D3 and D4 because diode D4 is reverse biased, and the anodes of diodes D3 and D4 will be held very close to each other. Thus, the depletion region from diode D4 shields diode D3 as in a convention JBS diode.

Thus, embodiments of the present invention may provide structures that block the current conduction in the built-in PiN diode in the JBS structure. For example, the series resistance R1, that may be provided by forming a highly resistive contact to the implanted regions of the junction barrier grid, may provide means, integral to the diode, for blocking current conduction of the built-in pn junction of the junction barrier grid.

Figure 4E:
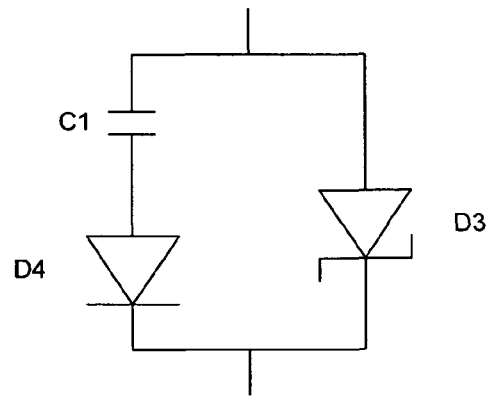
FIG. 4E is an equivalent circuit of a JBS diode according to embodiments of the present invention that provides a blocking insulator.

As seen in the equivalent circuit of FIG. 4E, some embodiments of the present invention may provide a series capacitance C1 as the current blocking structure 400 in series with the PiN diode D4 and the series combination is in parallel to the Schottky diode D3 provided by the Schottky contact to the n-type drift region. When the diode D3 is forward biased in steady state, the series capacitance C1 appears as an open circuit in the current conduction path through the diode D4 and blocks current flow through the PiN diode D4. When a reverse bias is applied to the structure, the diodes D3 and D4 will be in reverse bias. No current will flow through diode D3 and D4 because diode D4 is reverse biased, and the anodes of diodes D3 and D4 will be held very close to each other. Thus, the depletion region from diode D4 shields diode D3 as in a convention JBS diode.

Thus, embodiments of the present invention may provide structures that block the current conduction in the built-in PiN diode in the JBS structure. For example, the series capacitance C1, that may be provided by forming an insulator layer between the implanted regions of the junction barrier grid and the Schottky contact, may provide means, integral to the diode, for blocking current conduction of the built-in pn junction of the junction barrier grid.

Figure 5A:
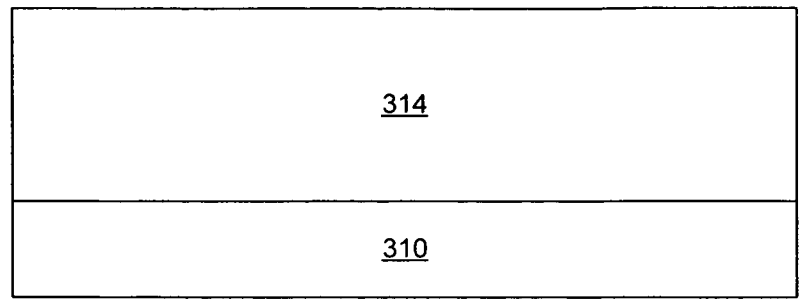
FIGS. 5A through 5E are cross-sectional diagrams illustrating fabrication of JBS diodes according to some embodiments of the present invention.

Fabrication of diodes, such as the diode illustrated in FIG. 3, will now be described with reference to FIGS. 5A through 5E. FIGS. 5A through 5E illustrate the formation of the junction barrier grid, however, as will be appreciated by those of skill in the art similar operations may be carried out in formation of the edge termination. As seen in FIG. 5A, an n− epitaxial layer 314 is grown on an n+ 4H-SiC substrate 310. The thickness and doping concentration of the n− epitaxial layer 314 may be as described above with reference to FIG. 3. Furthermore an optional n+ epitaxial layer 312 may be provided between the substrate 310 and the n− epitaxial layer 314. Techniques for forming silicon carbide epitaxial layers are known to those of skill in the art and, therefore, need not be described further herein.

Figure 5B:
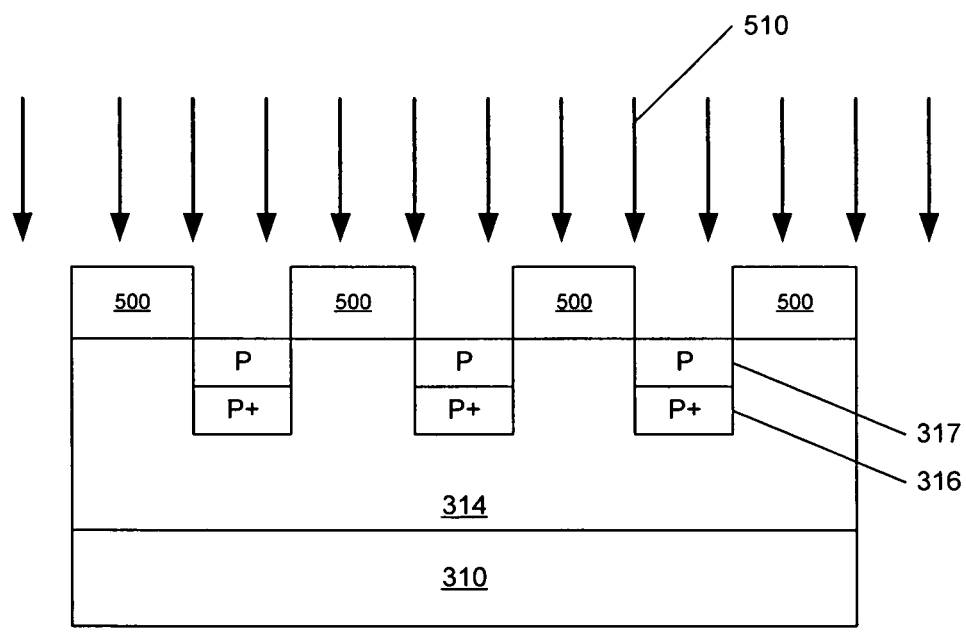

FIG. 5B illustrates the formation and patterning of an implantation mask 500 having openings corresponding to the locations of the junction barrier grid. A first implant is performed with a first implant energy to provide the first silicon carbide regions 316 and a second implant 510 is performed with a second implant energy less than the first implant energy to provide the second silicon carbide regions 317. Alternatively, a single implant may be provided where the profile of the implant results in a formation of a p+ region disposed in the n− epitaxial layer 314 and a p or p− region that extends to the surface of the n− epitaxial layer 314. More than two implants may also be used.

For the p-type implantation to provide the first and second regions 316 and 317, p-type species, such as aluminum and boron, may be selectively implanted. The ion implantation temperature can range from 0° C. to about 1300° C., and the type of masks for implantation may include photoresist and/or PECVD oxide. The total dose ($=\int N_A(x)dx$) of the implantation should be at least $1\times10^{13}$ cm$^{-2}$ to prevent punch-through in the blocking state, and the surface concentration of the implanted region should be $1\times10^{15}$ cm$^{-3}$ to $5\times10^{18}$ cm$^{-3}$. The lower concentration will result in higher blocking voltage for the p-type Schottky diode. The p-type implants can also be used to form edge termination structures, such as floating guard ring structures, as described above. For example, aluminum ions can be implanted with following schedule: 6e12 cm$^{-2}$ at 30 keV, 1.6e13 cm$^{-2}$ at 80 keV, 3.2e14 cm$^{-2}$ at 180 keV.

After implantation, the wafer is annealed at temperatures ranging from about 1300° C. to about 1800° C. to activate the implants and anneal defects. The anneal ambient should be controlled so that surface roughening can be avoided. For example, the activation anneal ambient may be a mixture of Ar and $SiH_4$. Alternatively or additionally, the surface of the wafer may be covered with a blanket deposition of graphite or AlN to provide surface protection during the anneal.

Figure 5C:
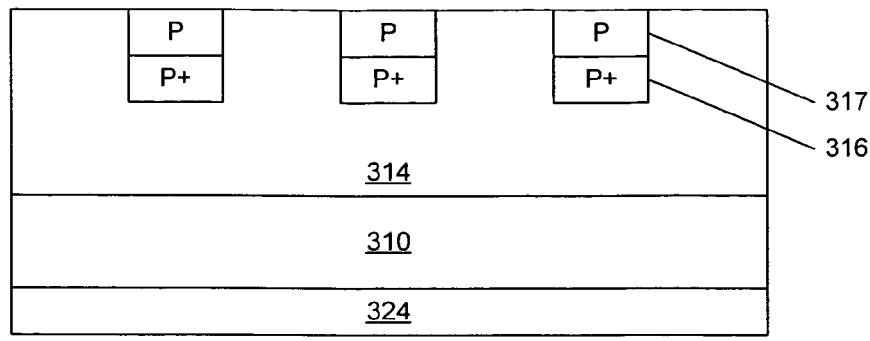

FIG. 5C illustrates the formation of the backside ohmic contact. After implant activation, the wafer is cleaned, and a thin layer of metal is deposited on the backside to provide the backside ohmic contact 324. The thickness of the metal layer can range from about 100 Å to 3000 Å. The metal may be include Ni, NiCr, Cr, Al, and/or Ti. In particular embodiments of the present invention, Ni is used as the backside metal. After the metal deposition, the wafer is subjected to a contact anneal in an inert ambient (Ar, nitrogen and/or forming gas). The contact anneal temperature can range from about 600° C. to about 1200° C.

Figure 5D:
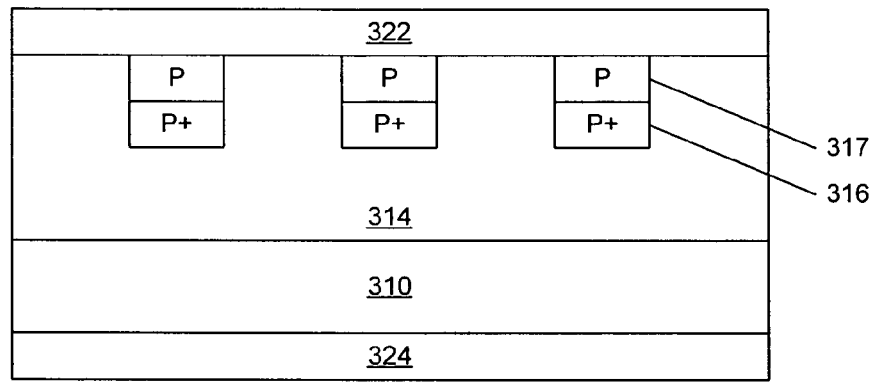

FIG. 5D illustrates formation of the Schottky contact 322. The frontside Schottky contact 322 is deposited and patterned. Such deposition and patterning may include formation of a thermal oxide on the epitaxial layer 314 and depositing an oxide on the thermal oxide as discussed above with reference to FIG. 3. An opening for the Schottky contact 322 may be formed in the oxide structure to expose the region of the epitaxial layer 314 that includes the implants 316 and 317. The Schottky metal is deposited on the oxide and the exposed portion of the epitaxial layer 314 and then patterned to provide the Schottky contact 322.

In some embodiments of the present invention, Ti and/or Ni may be used as the contact metal. The thickness of the Schottky contact 322 may range from about 500 Å to 5000 Å, and the Schottky contacts can be annealed at temperatures ranging from about 200° C. to about 800° C. In embodiments of the present invention where a rectifying contact is provided between the Schottky contact 322 and the regions 316 and 317, care should be taken that the rectifying contacts are formed on both n-regions and p implants. For example, the temperature should not exceed the specified range to prevent metal spiking, which can result in non-rectifying contacts.

Figure 5E:
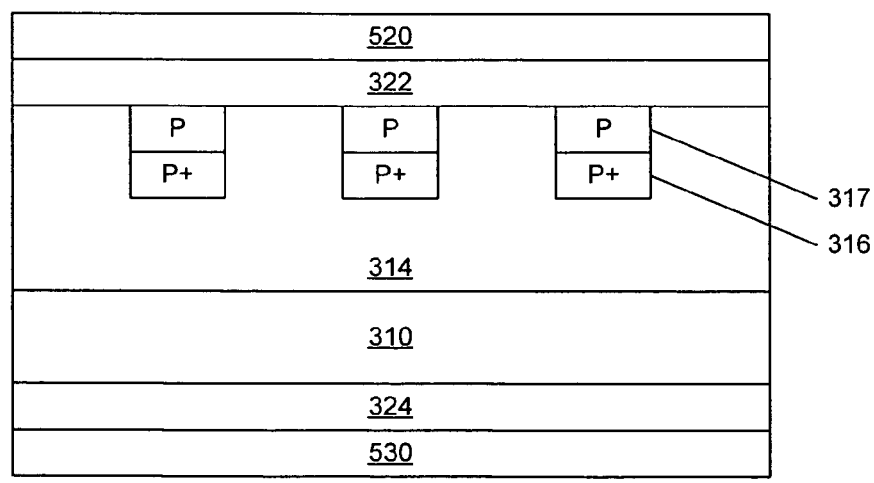

FIG. 5E illustrates the formation of optional metal overlayers 520 and 530. After formation of the Schottky contact 322, suitable metal layers may be deposited on both sides of the wafer. The backside of the wafer may be provided with a metal overlayer 530 of Ti/Ni/Ag or Ti/Pt/Au, which are suitable for soldering. The frontside of the wafer may be provide with a metal overlayer 520 Al or Ti/Pt/Au, which are suitable for wirebonding.

Figure 6:
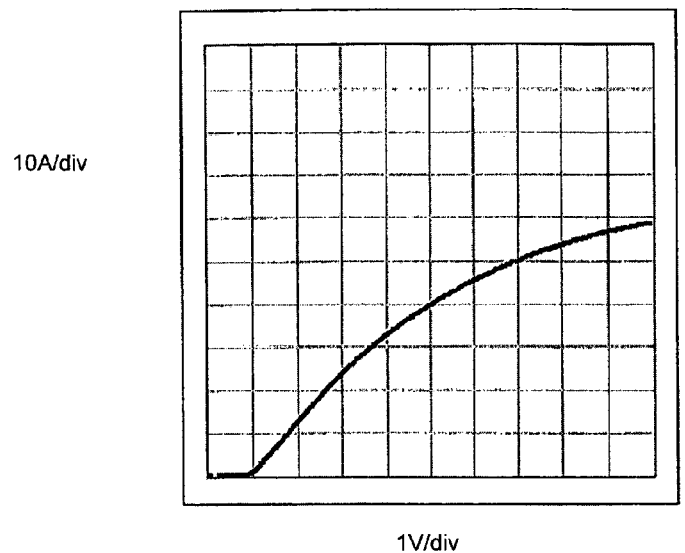
FIG. 6 is an I-V curve of a JBS diode according to some embodiments of the present invention.

FIG. 6 is an I-V curve of a JBS diode according to some embodiments of the present invention. The JBS diode has an active area of 0.045 $cm^2$. The p+ grids are approximately 1.5 μm wide, and the spacing between the grids are approximately 4 μm. The device has approximately 383 grid stripes. The epitaxial layer 314 has a doping concentration of approximately $5 \times 10^{15}$ $cm^{-3}$ and a thickness of 5.5 μm. The first implanted region 316 has a doping concentration of approximately $4 \times 10^{19}$ $cm^{-3}$ and extends from 0.2 μm to 0.4 μm into the epitaxial layer 314, and the second implanted region 317 has a doping concentration of around $2 \times 10^{17}$ $cm^{-3}$ and extends 0.2 μm into the epitaxial layer 314 from the surface of the epitaxial layer 314. At a forward bias of 10 V, a forward current of 60 A (=1.3 $kA/cm^2$) is provided. The I-V characteristics does not show signs of the pn-junction turn-on. The forward currents for biases beyond 5V are limited by carrier velocity saturation.

FIG. 7 is a cross-section of a junction barrier Schottky diode 700 according to further embodiments of the present invention. As seen in the junction barrier region 716 may be provided by a conventionally implanted p-type region or by the implanted regions 316 and 317 described above and an insulator region 720 is provided between the junction barrier region 716 and the Schottky contact metal 322. The insulator region 720, for example, be provided by masking and etching the oxide layer 320 or masking and etching the first thermal oxide layer 319 prior to deposition of the second deposited oxide layer 321. Alternatively, a separate insulator material may be formed on the junction barrier region 716 by, for example, blanket deposition, masking and etching, selective deposition and/or growth, lift off techniques or other techniques known to those of skill in the art. The insulator region 720 may be any suitable insulator material, such as, for example, $TnO_2$, $SiO_2$, SiN, oxynitride or the like. The insulator region 720 may be disposed on the implanted junction barrier region 716 to block current conduction between the junction barrier region 716 and the Schottky contact metal 322.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A diode comprising:
    a silicon carbide drift region;
    a Schottky contact on the silicon carbide drift region and forming a Schottky junction with the silicon carbide drift region; and
    a silicon carbide junction barrier region disposed within the silicon carbide drift region of the diode, the silicon carbide junction barrier region comprising:
    a plurality of first regions of silicon carbide having respective first doping concentrations in the silicon carbide drift region of the diode; and
    a plurality of second regions of silicon carbide in the silicon carbide drift region and disposed between the plurality of first regions of silicon carbide and the Schottky contact of the diode and in electrical contact with the plurality of first regions of silicon carbide and the Schottky contact so that the plurality of first regions of silicon carbide are spaced apart from the Schottky contact by the plurality of second regions of silicon carbide, the plurality of second regions of silicon carbide having respective second doping concentrations that are less than the first doping concentrations and forming resistive ohmic contacts with the Schottky contact, wherein the second regions of silicon carbide have a surface doping concentration at the resistive ohmic contacts of from $10^{17}$ $cm^{-3}$ to about $5 \times 10^{18}$ $cm^{-3}$; and the silicon carbide drift region has a first conductivity type opposite a second conductivity type of the first regions and the second regions;
    wherein the plurality of first and second regions define a junction barrier grid that is configured to shield the Schottky junction when a reverse bias is applied to the diode.

2. The diode of claim 1, wherein the silicon carbide drift region comprises n-type silicon carbide and the first and second regions comprise p-type silicon carbide.

3. The diode of claim 2, wherein the second regions of silicon carbide extend into the silicon carbide drift region from about 0.01 to about 0.5 μm from a surface of the silicon carbide drift region and the first regions of silicon carbide extend into the silicon carbide drill region from about 0.1 to about 1 μm from the surface of the silicon carbide drift region.

4. The diode of claim 2, wherein the silicon carbide drift region comprises a first n-type silicon carbide epitaxial layer.

5. The diode of claim 4, further comprising an n-type silicon carbide substrate having a doping concentration greater than a doping concentration of the first n-type silicon carbide epitaxial layer, the first n-type silicon carbide epitaxial layer being disposed on the n-type silicon carbide substrate.

6. The diode of claim 5, farther comprising a second n-type silicon carbide epitaxial layer disposed between the first silicon carbide epitaxial layer and the n-type silicon carbide substrate, the second n-type silicon carbide epitaxial layer having a higher carrier concentration than the first n-type silicon carbide epitaxial.

7. The diode of claim 5, further comprising an ohmic contact on the silicon carbide substrate opposite the first n-type silicon carbide epitaxial layer.

8. The diode of claim 1, further comprising a plurality of floating field rings surrounding the silicon carbide junction barrier region.

9. The diode of claim 1, wherein the plurality of first regions comprise p+ regions.

10. The diode of claim 1, wherein the plurality of first regions have a doping concentration of from about $\times 10^{19}$ cm$^{-3}$ to about $1 \times 10^{21}$ cm$^{-3}$.

* * * * *

UNITED STATES PATENT AND TRADEMARK OFFICE
CERTIFICATE OF CORRECTION

PATENT NO. : 8,901,699 B2  Page 1 of 1
APPLICATION NO. : 11/126816
DATED : December 2, 2014
INVENTOR(S) : Ryu et al.

It is certified that error appears in the above-identified patent and that said Letters Patent is hereby corrected as shown below:

In the Claims:
Column 14, Claim 3, Line 66: Please correct "drill region"
to read -- drift region --

Column 15, Claim 10, Lines 24 and 25: Please correct "about × $10^{19}$ cm$^{-3}$"
to read -- about 1 × $10^{19}$ cm$^{-3}$ --

Signed and Sealed this
Twelfth Day of May, 2015

Michelle K. Lee
*Director of the United States Patent and Trademark Office*